United States Patent [19]

Antreasyan et al.

[11] Patent Number: 5,309,465
[45] Date of Patent: May 3, 1994

[54] RIDGE WAVEGUIDE SEMICONDUCTOR LASER WITH THIN ACTIVE REGION

[75] Inventors: Arsam Antreasyan, Hopewell Junction, N.Y.; Greg Costrini, Austin, Tex.; Peter D. Hoh, Hopewell Junction, N.Y.

[73] Assignee: International Business Machines Corporation, Armonk, N.Y.

[21] Appl. No.: 972,049

[22] Filed: Nov. 5, 1992

[51] Int. Cl.$^5$ .............................................. H01S 3/18
[52] U.S. Cl. ...................................... 372/43; 372/45; 372/48; 372/50
[58] Field of Search ............... 372/43, 44, 45, 46, 372/47, 48, 50, 66, 7; 385/130, 131, 132

[56] References Cited

U.S. PATENT DOCUMENTS

| | | | |
|---|---|---|---|
| 4,434,491 | 2/1984 | Sakuma et al. | 372/48 |
| 4,575,919 | 3/1986 | Logan et al. | 372/43 X |
| 4,644,552 | 2/1987 | Ohshima et al. | 372/45 |
| 4,788,688 | 11/1988 | Hasenberg et al. | 372/45 |
| 4,866,723 | 9/1989 | Van Dongen | 372/46 |
| 4,899,361 | 2/1990 | Numai | 372/50 |
| 4,905,057 | 2/1990 | Ohishi et al. | 357/17 |
| 4,910,744 | 3/1990 | Yoshida et al. | 372/46 |
| 5,003,548 | 3/1991 | Bour et al. | 372/44 |
| 5,016,252 | 5/1991 | Hamada et al. | 372/45 |
| 5,036,522 | 7/1991 | Tanguy et al. | 372/46 |
| 5,042,049 | 8/1991 | Ohtoshi et al. | 372/45 |
| 5,091,916 | 2/1992 | Cimini, Jr. et al. | 372/96 |
| 5,175,740 | 12/1992 | Elman et al. | 372/45 |
| 5,179,566 | 1/1993 | Iwano et al. | 372/45 |
| 5,237,639 | 8/1993 | Kato et al. | 372/43 X |
| 5,260,230 | 11/1993 | Kondo | 372/43 X |

Primary Examiner—Brian Healy
Attorney, Agent, or Firm—Perman & Green

[57] ABSTRACT

The present invention provides an improved semiconductor ridge waveguide laser structure having a plurality of layers including an N-InP buffer layer and an N-type InP substrate, a thin InGaAsP active layer 1100 Angstroms thickness, a P-InP graded layer, an optional etch stop layer, a P-InP cladding layer and a P+InGaAs. The ridge waveguide laser of the present invention demonstrates a very high reliability and the fabrication process therefor is high yield. The ridge waveguide laser of the present invention demonstrates very good high temperature behavior and the design suppresses higher order modes.

4 Claims, 2 Drawing Sheets

RIDGE WAVEGUIDE SEMICONDUCTOR LASER WITH THIN ACTIVE REGION

BACKGROUND OF THE INVENTION

1. Field of the Invention

The present invention relates to ridge waveguide semiconductor lasers, and more particularly to a multi-layer structure and fabrication process for a 1300nm ridge waveguide structure.

A ridge waveguide laser is a semiconductor light-emitting device which includes a ridge-shaped layer on a semiconductor wafer. It is one of the fundamentally simplest and most reliable laser devices available today.

One such laser and its fabrication process has been described in an article "High Power Ridge-Waveguide AlGaAs GRINSCH Laser Diode" by C. Harder et al. (published in Electronics Letters, Sep. 25, 1986, Vol. 22, No. 20, pp. 1081-1082).

In the past, most of the efforts made in designing semiconductor lasers were directed to GaAs-system devices operating at a wavelength of about 0.8 um. However, particularly for communications applications, lasers emitting beams of longer wavelength (in the order of 1.3 um) are also in great demand since they better match the transmission characteristics of the optical fiber links often used. An extensive survey on such structures, including ridge waveguide lasers, and their performance is given in chapter 5 of a book entitled "Long Wavelength Semiconductor Lasers" by G. P. Agrawal and N. K. Dutta (Van Nostrand Reinhold Company, N.Y.).

Semiconductor lasers operating in this region of the infrared usually comprise regions of indium phosphide (InP) and of quaternary materials indium gallium arsenide phosphides ($In_xGa_{1-x}As_yP_{1-y}$). By suitable choices of x and y it is possible to lattice-match the various regions while varying the band gaps of the materials. (Band gaps can be determined experimentally by, for example, photoluminescence.) Additionally, both indium phosphide and the quaternary materials can be doped to be p- or n-type as desired.

Ridge waveguide lasers have also been previously described, for example, in the following publications of Kaminow and his coworkers: Electronics Letters, 1979, vol. 15, pp. 763-765; Electronics Letters, 1981, vol. 17, pp. 318-320; Electronics Letters, 1983, vol. 19, pp. 877-879.

SUMMARY OF THE INVENTION

The present invention provides an improved semiconductor ridge waveguide laser structure having a plurality of layers including an N-InP buffer layer and an N-type InP substrate, a thin InGaAsP active layer, a P-InP graded layer, an optional etch stop layer, a P-InP cladding layer and a P + InGaAs. The ridge waveguide laser of the present invention demonstrates a very high reliability and the fabrication process therefor is high yield. The ridge waveguide laser of the present invention demonstrates very good high temperature behavior and the design suppresses higher order modes.

DESCRIPTION OF THE PREFERRED EMBODIMENT

Figure 1:
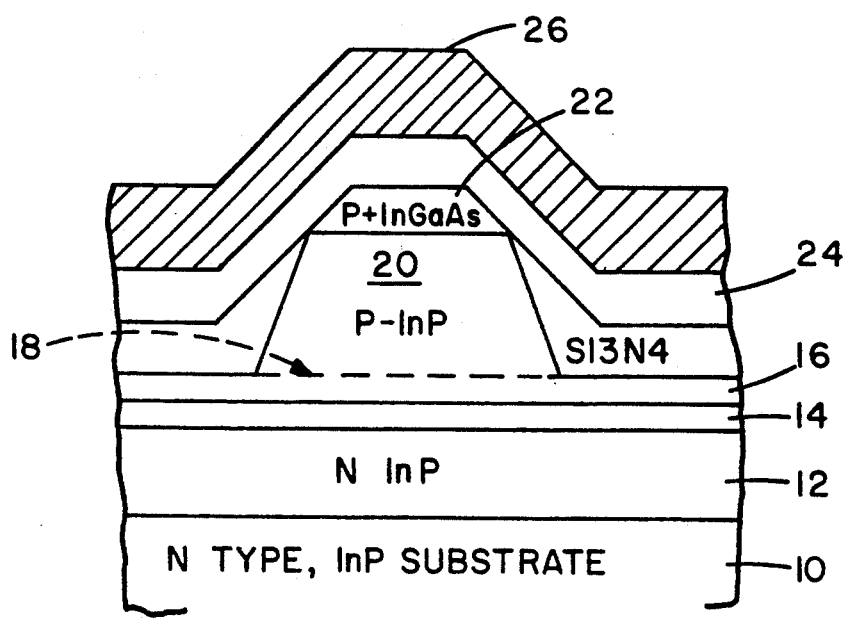
FIG. 1 is a schematic cross-sectional view illustrating an embodiment of a ridge waveguide laser according to the principles of the present invention.

The embodiment of the ridge waveguide laser structure of the present invention is shown in FIG. 1. The structure includes a substrate composed of an N-type indium phosphide (InP) substrate 10. A buffer layer 12 composed of N-InP is grown on substrate 10. A lightly n-doped thin quaternary active layer 14 of indium gallium arsenide phosphide (InGaAsP) is grown on the buffer layer 12. Layer 16 is a lightly p-doped, graded InP layer which is grown on layer 14. An optional quanternary etch stop layer 18 composed of InGaAsP having a 1.08 eV band gap may be disposed over layer 16.

A cladding layer 20 composed of P-InP is disposed on a portion of layer 18 and a P + InGaAs layer 22 or P+ quanternary contact layer InGaAsP disposed over layer 20. A Ti/Pt/Au layer 24 is provided as a p-contact metalization and backside metalization layer 26 of Au/Ge/Ni/Au is disposed over layer 24.

The thickness and the doping concentration of the aforesaid layers for the embodiment of FIG. 1 are as follows:

| LAYER | | THICKNESS | DOPING | $In(1-x)Ga(x)As(y)P(1-y)$ COMPOSITION | |
|---|---|---|---|---|---|
| (12) | InP | 1.2 um | 10E18 cm | x = 0; | y = 0 |
| (14) | InGaAsP | 0.11 um | UNDOPED | x = 0.279; | y = 0.606 |
| (16) | InP | 0.1 um | UNDOPED-10E17 cm GRADED | x = 0; | y = 0 |
| (18) | InGaAsP | 3-10 nm | 10E17 cm | x = 0.182; | y = 0.405 |
| (20) | InP | 1.4 um | 10E17-10E18 cm GRADED | x = 0; | y = 0 |
| (22) | InGaAs or | 0.3 um | 5 × 10E19 cm | x = 0.47; | y = 1 |
| | (InGaAsP) | 0.3 um | 5 × 10E19 cm | x = 0.279; | y = 0.606 |

An important and distinctive feature of the embodiment of FIG. 1 is the incorporation of a 1100 angstrom thick InGaAsP active region 14. The active region 14 is thinner than the commonly employed 1500 angstrom thick active region of prior art devices. With a 1500 Angstrom layer the broad area threshold current density of the laser is minimized, however since ridge waveguide lasers have considerable amount of current spreading (about 70% of total current), and the current density being a slow changing function of active layer thickness, the employment of a thin active layer does not impact the overall performance of the laser. The added benefits of a 1100 angstrom thick active layer are very important. T-0 level investigations have shown that about 30% of the lasers have kinks as a result of having a cavity that is too wide and thus supports higher order modes. Also, the fundamental mode is confined within the area defined by the ridge width, while the higher order modes are spreading outside the ridge area in the lateral direction. Thus, the thin active region spreads out the field distribution in the vertical direction resulting in a high loss for the higher modes while the fundamental mode remains with very low loss, i.e., free carrier recombination in the active region. The elimination of higher order modes yields kink free lasers, thus improving the functional yield.

Figure 2:
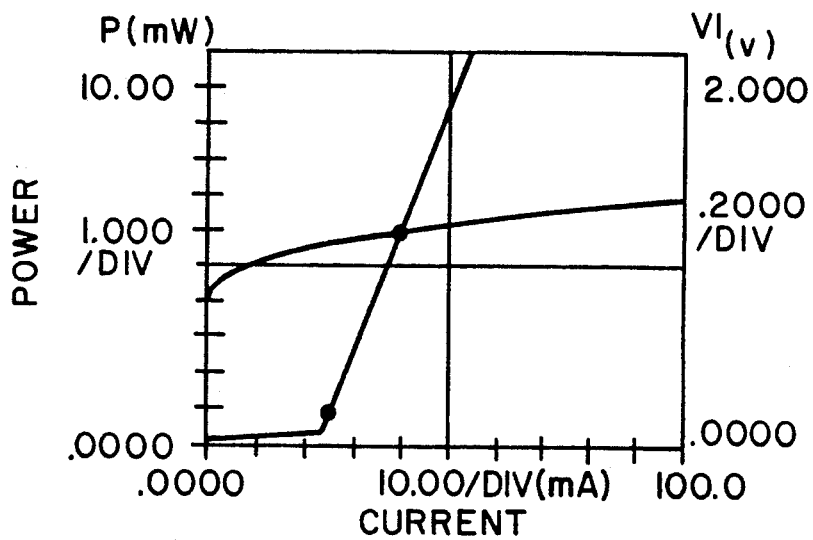
FIGS. 2, 3, 4 and 5 are illustrations of power-current curves and field intensity curves used in the description of the present invention.
Figure 3:
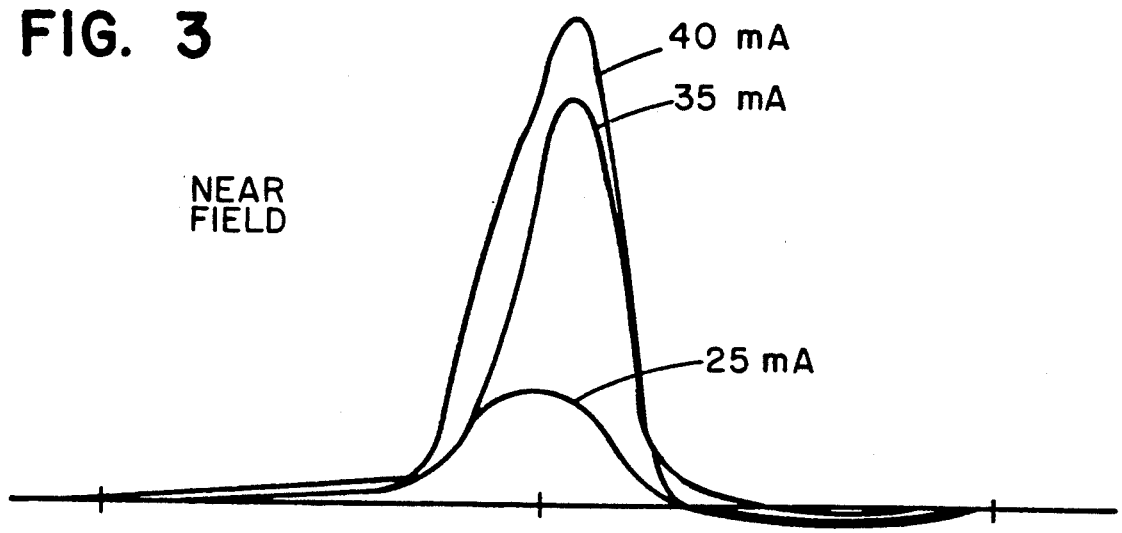
Figure 4:
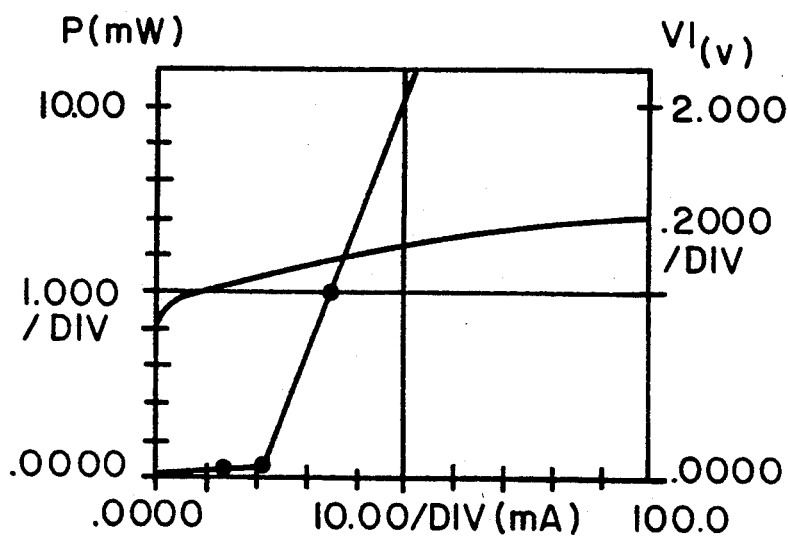
Figure 5:
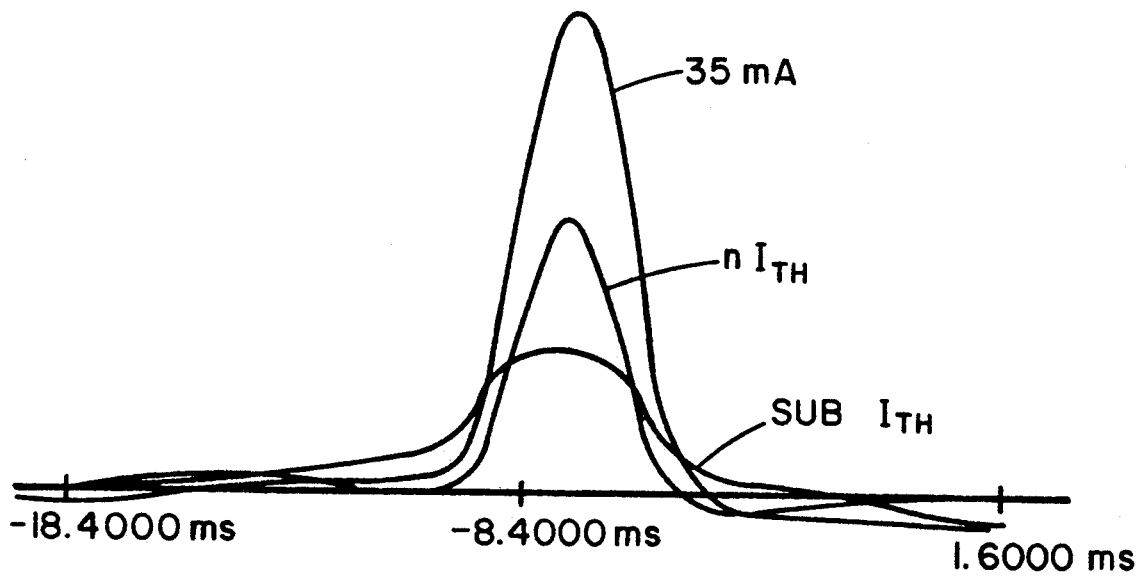

A laser with kinks provides a power-current profile as illustrated in FIG. 2 and a near field intensity curves as shown in FIG. 3. The power-current curves and near field intensity for a laser without kinks are illustrated in FIGS. 4 and 5.

Another significant advantage of the thin 1100 angstrom active region 14 is that it results in a much reduced temperature sensitivity of the external differential quantum efficiency, i.e., from $-1.0\%/C$ at T0 level down to $-0.5\%/C$ at T1 level. One explanation of this phenomenon is the reduction of the ambipolar diffusion which causes additional lateral current spreading inside the active region. Another explanation is that the thinner layer or the shorter growth time that leads to a thinner active layer is also reduces: the number of defects inside the active area which may act as nonradiative recombination centers. With the quantum efficiency being less sensitive to rising ambient temperature, the performance of the lasers at elevated temperatures are tremendously enhanced, yielding devices lasting up to or above 110° C.

A still further improvement provided by the ridge waveguide laser of the present invention is the use, if desired, of a thin quantum well as the etch stoplayer 18. This layer has a lower bandgap than the surrounding InP layers, introducing a barrier for holes. The choice of a thin layer reduces adverse effects on the forward voltage-current characteristics of the laser as result of this barrier. Also, this layer has a different refractive index than the surrounding InP layers which in turn influences waveguides properties inside the active region. Thus, again the choice of a thin quantum well is beneficial. The chemical etch used to etch the cladding InP layer (20) stops naturally as soon as layer 18 is exposed. Furthermore, it enables the use of $HCl:H_3PO_4=3:1$ as a cladding etch which would yield nearly vertical sidewalls if the ridges are oriented perpendicular to the large flat, making dry etching completely unnecessary. The ability to have a well controlled wet etching process is critical for the successful design of the laser in terms of reducing the threshold current.

The InP layer 16 with a graded doping profile serves two purposes. The low doping adjacent to the active layer reduces the diffusion of Zn the p-dopant, into the active layer. The low doping in this layer also eliminates current spreading and reduces the threshold current. The choice of a 0.1 um thickness enables the wet chemical etching to be stopped sufficiently far away from the active layer 14 in order to avoid reliability problems.

The P+ contact layer 22 can be either ternary or quaternary. A ternary InGaAs layer is more convenient in terms of wet chemical etching and provides low ohmic contact. A quaternary layer with a bandgap higher than that of the active region has no absorption, thus the thickness of the cladding region 20 can be reduced further.

To fabricate the ridge waveguide laser of the present invention, a multilayer wafer is formed by growing layers 12, 14, 16, 18, 20 and 22 of the specified material on the N-type, InP substrate 10. The layers may be grown using molecular vapor phase epitaxy (MOVPE) techniques.

Next the ridge structure pattern is defined by photoresist lithography. The contact layer 22 is etched through the photoresist mask using $H_2SO_4:H_2O_2:H_2O=8:1:100$. Then the cladding layer 20 is etched using either $HBr:CH_3COOH=1:1$ at 5 degrees centigrade or $HCl:H_3PO_4=3:1$ at room temperature. Either etchant stops at the etch stop layer 18.

A layer of silicon nitride $Si_3N_4$ is deposited by plasma enhanced chemical vapor (PECVD) deposition for use as an insulator and a consecutive lift-off process exposes the top of the contact layer 22 for metalization.

A second photolithographic step is implanted and Ti/Pt/Au layer is deposited as a p-contact metalization is defines by lift-off. After thinning and the deposition of backside metalization Au/Ge/Ni/Au the wafer is annealed. Individual laser structures are subsequently formed from the fabricated unit by a cleaning process.

What has been described is an improved semiconductor ridge waveguide laser structure incorporating a thin active InGaAsP region 1100 Angstroms thick with graded profile InP cladding layers on either side and a InGaAsP etch stop layer. The improved laser demonstrates high reliability with high fabrication yield and enhanced high temperature behavior. Also ;during operation of the laser, higher order modes are suppressed.

What is claimed is:

1. A semiconductor ridge waveguide structure comprising:
    a semiconductor substrate
    a buffer layer disposed on said substrate,
    a thin active layer composed of InGaAsP of substantially 1100 angstrom thickness disposed on said buffer layer for spreading the field distribution of higher order laser modes in the vertical direction, and
    a layer composed of InP disposed on said active layer having a ridge portion thereon, and a contact layer disposed on said ridge portion, wherein said semiconductor substrate and said buffer layer is composed of InP doped with first type impurities and said InP layer disposed on said active layer is graded and doped with second type impurities and wherein an etch stop layer composed of InGaAsP is disposed on said graded InP layer.

2. A semiconductor ridge waveguide structure according to claim 1 wherein said semiconductor substrate and said buffer layer is composed of N doped InP and said graded layer is composed of P doped InP.

3. A semiconductor ridge waveguide structure according to claim 2 wherein said contact layer is ternary and composed of InGaAs.

4. A semiconductor ridge waveguide structure according to claim 2 wherein said contact layer is quaternary and composed of InGaAsP.

* * * * *